United States Patent [19]
Coffman et al.

[11] Patent Number: 5,668,769
[45] Date of Patent: Sep. 16, 1997

[54] MEMORY DEVICE PERFORMANCE BY DELAYED POWER-DOWN

[75] Inventors: Tim M. Coffman; Ronald J. Syzdek, both of Sugar Land; Timothy J. Coots, The Woodlands; Phat C. Truong; Sung-Wei Lin, both of Houston, all of Tex.

[73] Assignee: Texas Instruments Incorporated, Dallas, Tex.

[21] Appl. No.: 560,229

[22] Filed: Nov. 21, 1995

[51] Int. Cl.$^6$ .......................................... G11C 7/00
[52] U.S. Cl. ..................... 365/226; 365/227; 365/194; 327/285; 327/288
[58] Field of Search ........................... 365/226, 227, 365/194; 327/51, 534, 535, 285, 288, 205, 544, 545; 326/38

[56] References Cited

U.S. PATENT DOCUMENTS 5,033,026  7/1991  Tsujimoto ............................. 365/194

Primary Examiner—David C. Nelms
Assistant Examiner—F. Niranjan
Attorney, Agent, or Firm—Theodore D. Lindgren; Leo N. Heiting; Richard L. Donaldson

[57] ABSTRACT

The method of this invention prevents transient currents at high-frequency disable cycles and disables DC current paths after a minimum delay time, thereby reducing power dissipation. This invention includes a delay circuit functioning to prevent disablement of DC paths where chip-disable times occur at intervals below a minimum duration. The result is a decrease in the number of undesired voltage drops on internal power buses due to transient currents. The method detects external chip-disable pulses that occur before a minimum time duration, then prevents those pulses from powering down internal direct-current paths. At the same time, the output driver high impedance functionality of the chip-disable signal is preserved.

5 Claims, 3 Drawing Sheets

MEMORY DEVICE PERFORMANCE BY DELAYED POWER-DOWN

BACKGROUND OF THE INVENTION

This invention relates to integrated circuits having a Chip-Enable function. More particularly, this invention relates to an apparatus and a method for providing improved memory device performance by delayed internal power-down.

Prior-art in the area of delayed power-down operation includes circuitry for driving hard-disk drives of computers. One of the problems involving such disk-drive circuitry is deciding when to stop, or power-down, spinning of the disk platter. The trade-off is the power saved during intervals when the disk platter is stopped from Spinning versus the large surge in power consumption if the disk is stopped, then re-started.

A similar problem arises when designing automatic power-down circuitry for use in integrated circuits. Instead of power consumption by starting and stopping of the disk platter, power is consumed by transient voltages and currents within the integrated circuit during short disable cycles.

A standard control feature implemented in memory and other integrated-circuit devices is the Chip-Enable function. This control input is used to place the output drivers in a high impedance state and to disable DC current paths to reduce power dissipation. The read path is typically disabled (powered-down), which includes disabling blocks such as input buffers, sense amplifiers, and output stages. While in the disabled state, these circuit block outputs default to a fixed state (usually all "zeros" or all "ones"). When the device is re-enabled with the chip-enable signal, the states of the previously disabled blocks are brought from the default states to an activated condition. Returning the device to the activated condition causes transient current consumption (power consumption) even though there is no change with respect of the device state prior to the disable or power-down cycle.

The Chip-Enable function is very effective at reducing overall power consumption at low-frequency operation (long intervals between disable cycles). However, at high frequencies (short intervals between disable cycles) the transient current consumption increases the total power required by the device. The transient currents also lead to voltage drops on internal power buses and degraded performance due to those voltage drops.

There is need for a Chip-Enable function that prevents transient currents at high-frequency disable cycles and that also allows the disablement of DC current paths, thereby reducing power dissipation.

SUMMARY OF THE INVENTION

The method of this invention prevents transient currents at high-frequency disable cycles and disables DC current paths after a minimum delay time, thereby reducing power dissipation. This invention includes a delay circuit functioning to prevent disablement of DC paths where chip-disable times occur at intervals below a minimum duration. The result is a decrease in the number of undesired voltage drops on internal power buses due to transient currents. The method detects external chip-disable pulses that occur before a minimum time duration, then prevents those pulses from powering down internal direct-current paths. At the same time, the output driver high impedance functionality of the chip-disable signal is preserved.

DETAILED DESCRIPTION OF THE INVENTION

Figure 1:
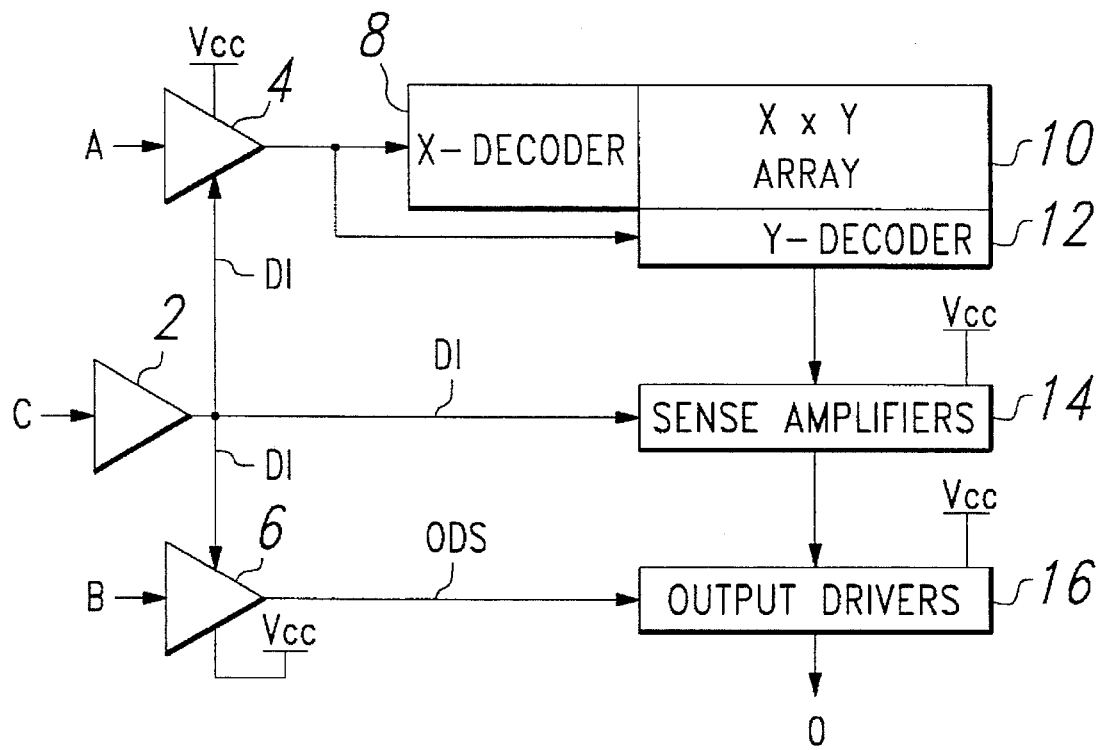
FIG. 1 is a block diagram of a prior-art memory device incorporating a Chip-Enable function.

FIG. 1 illustrates a block diagram of a prior-art memory device incorporating a Chip-Enable function. Input signal A is the external address input to address buffer 4. Only one of several such address buffers 4 is shown in FIG. 1. Input signal C is the chip-enable input to chip-enable buffer 2. Input signal B is the output-disable input to output-disable buffer 6. A row decoder 8 (X-DECODER 8) and a column decoder 12 (Y-DECODER 12) receive address inputs from address buffer 4 and select decode locations from an X×Y memory ARRAY 18. SENSE AMPLIFIERS 14 sense the state of the memory array decoded by Y-DECODER 12. The SENSE AMPLIFIERS 14 are powered down by the output signal DI from the chip-enable buffer 2. OUTPUT DRIVERS 16 receive inputs from the SENSE AMPLIFIERS 14 and drive the chip output bus terminal O. The OUTPUT DRIVERS 16 also receive an output-disable signal ODS from the output-disable buffer 6.

In FIG. 1, voltage supply $V_{cc}$ connections are shown for address buffer 4, output-disable buffer 6, SENSE AMPLIFIERS 14 and OUTPUT DRIVERS 16. The term "enable" as used herein is defined to mean that current is allowed to be drawn from voltage supply $V_{cc}$ for use in performing the particular function of each of the foregoing block-diagram circuits. The term "disable" as used herein is defined to mean that no current is allowed to be drawn from the voltage supply $V_{cc}$ for operation of the foregoing block-diagram circuits. While voltage supply $V_{cc}$ connections are not shown for X-DECODER 8 and Y-DECODER 12 such connections may exist, along with enable/disable inputs.

When the device is active, address buffer 4, output-disable buffer 6 and OUTPUT DRIVERS 16 are enabled. The X-DECODER 8 and the Y-DECODER 12 receive address inputs from the address buffer 4. The X-DECODER 8 and Y-DECODER 12 select memory locations from the memory ARRAY 10 and each location is sensed by SENSE AMPLIFIERS 14. The SENSE AMPLIFIERS 14 output is then driven to the chip output bus terminal O by the OUTPUT DRIVERS 16.

When the chip is disabled, the chip-enable buffer 2 powers down address buffer 4, output-disable buffer 6 and SENSE AMPLIFIERS 14. When the output-disable buffer 6 is powered down, it causes the outputs at bus terminal O of the OUTPUT DRIVERS 16 to enter a high impedance state. All of the powered-down circuit blocks default to a fixed state (logically high or low). This in turn causes X-DECODER 8 and Y-DECODER 12 to select a default location within the memory ARRAY 18.

When the chip is re-enabled, the output of chip-enable buffer 2 powers up address buffer 4, output-disable buffer 6, and SENSE AMPLIFIERS 14. The internal addresses from address buffer 4 et al. are driven from the default state to a state determined by their inputs A. X-DECODER 8 and Y-DECODER 12 select the addressed location in memory ARRAY 10. SENSE AMPLIFIERS 14 sense the state of the addressed memory locations. OUTPUT DRIVERS 16 drive the data from SENSE AMPLIFIERS 14 to the device output bus terminal O.

Figure 3:
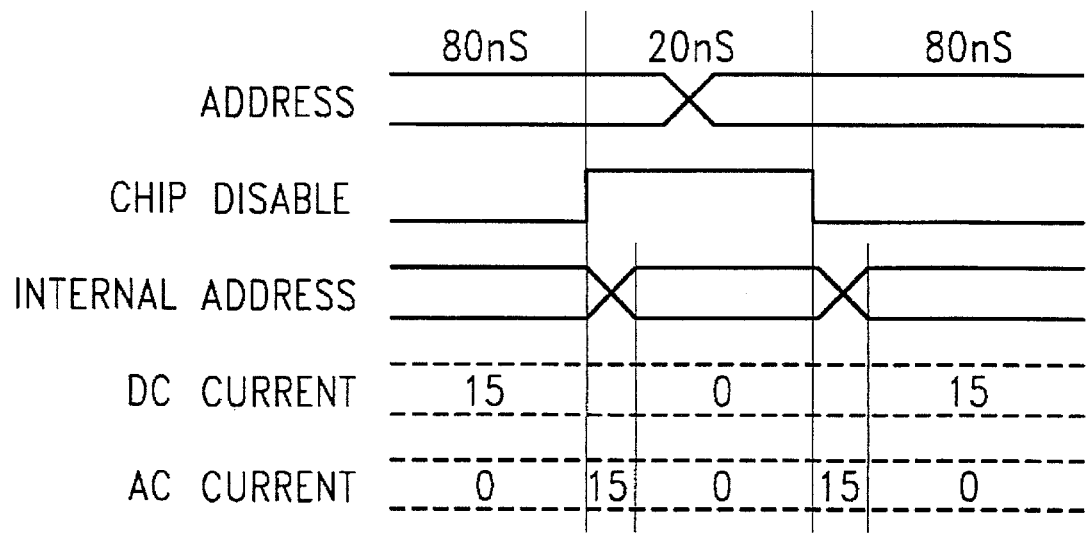
FIG. 3 is a waveform drawing illustrating operation of the prior-art, short-disable-time memory device of FIG. 1.

FIG. 3 shows waveform drawings of a prior-art memory device with a short disable time. The ADDRESS waveform corresponds to input A in FIG. 1. The CHIP-DISABLE waveform corresponds to the input C in FIG. 1. The INTERNAL ADDRESS waveform corresponds to the outputs of address buffer 4 in FIG. 1. In FIG. 3, the CHIP-DISABLE signal goes active after eighty nanoseconds. The chip remains disabled for twenty nanoseconds before it is re-enabled. A single transition occurs in the ADDRESS input waveform while the chip is disabled. The INTERNAL ADDRESS waveform has two transitions. The first transition occurs when the CHIP-DISABLE signal goes high. The second INTERNAL ADDRESS transition occurs when the CHIP-DISABLE signal goes low. The time-averaged DC CURRENT for the waveform in FIG. 3 is fifteen milliamperes. There are two transitions that cause a time-averaged AC CURRENT of fifteen milliamperes each. The total current consumption for a 100 nanosecond cycle is the sum of the DC CURRENT and the AC CURRENT components. In this example, the total time-averaged current consumption is 45 milliamperes (15+15+15).

The voltage drop on the internal power buses is proportional to the current consumption of the device. The single short chip-disable pulse causes two internal address transitions. This doubles the AC current consumption of the device and its associated voltage degradation on the power busses.

Figure 2:
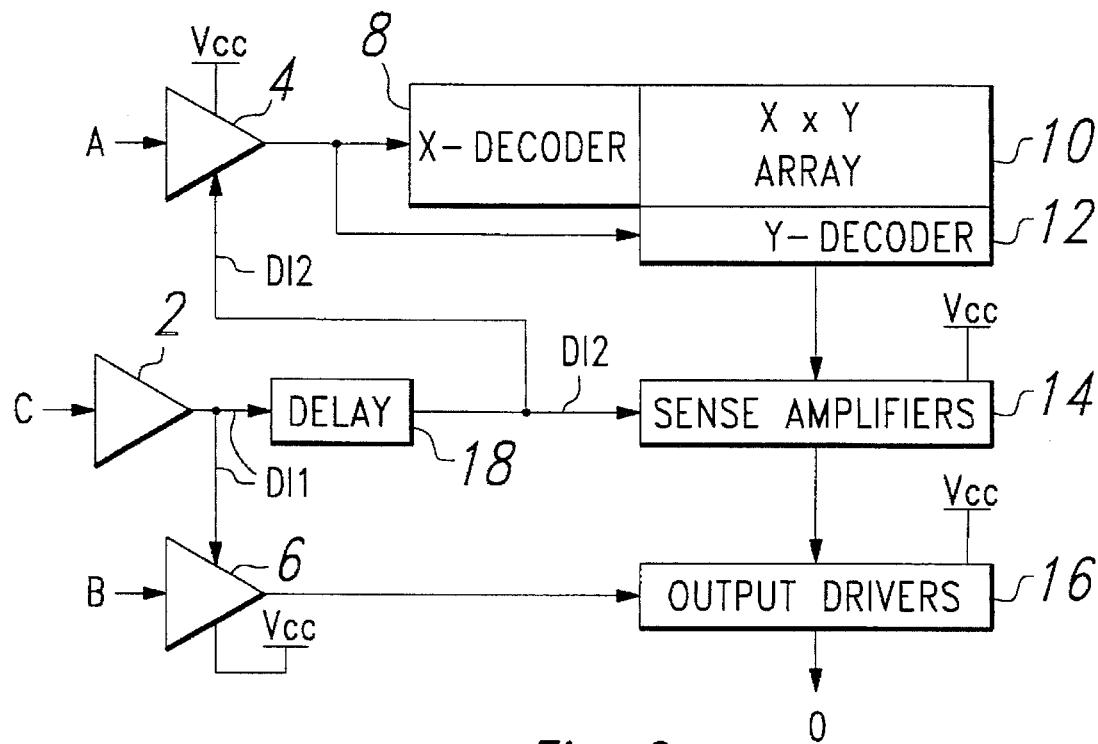
FIG. 2 is a block diagram of a memory device incorporating an improved Chip-Enable function.

FIG. 2 shows a block diagram of a memory device incorporating an improved chip-enable function. All of the blocks in FIG. 2 correspond to those in the prior-art circuit of FIG. 1 with the following exceptions. A DELAY stage 18 is inserted between the output of chip-enable buffer 2 and the disable inputs DI2 of address buffer 4 et al. and SENSE AMPLIFIERS 14. The DELAY stage 18 is designed such that disable times below a minimum duration are ignored. At minimum cycle time, address buffer 4 and SENSE AMPLIFIERS 14 remain active and the selected memory ARRAY 18 location determined by X-DECODER 8 and Y-DECODER 12 follow address inputs A. Output-disable buffer 6 is connected as in FIG. 1 to maintain the OUTPUT DRIVERS 16 high impedance control.

Figure 4:
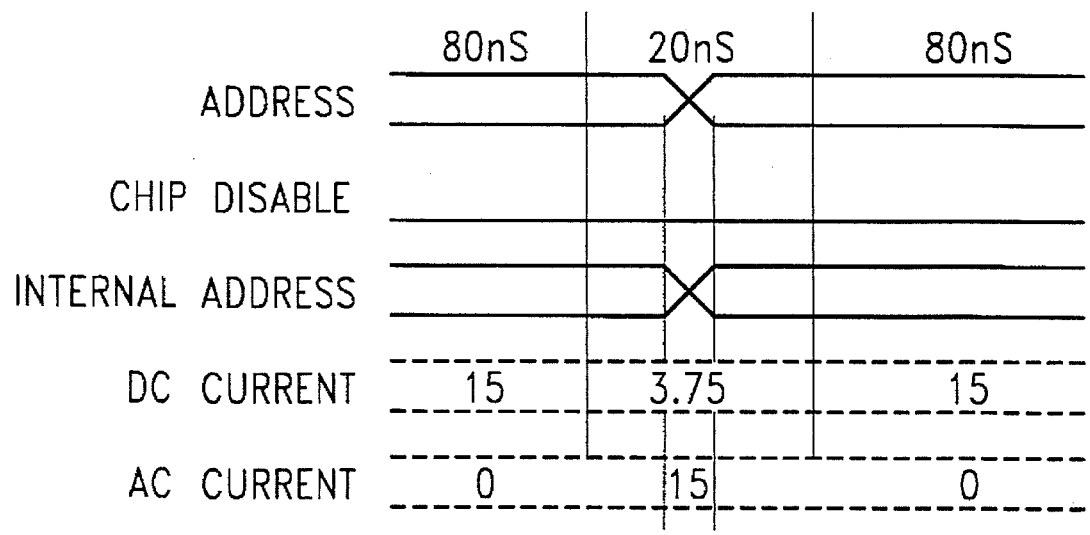
FIG. 4 is a waveform drawing illustrating operation of the improved memory device of FIG. 2, which ignores short disable times.

FIG. 4 shows a waveform drawing of the improved memory device with short disable times ignored. As in FIG. 3, the CHIP-DISABLE waveform corresponds to the input signal C in FIG. 2. The INTERNAL ADDRESS waveform corresponds to the outputs of address buffer 4 in FIG. 2. In FIG. 4, the CHIP-DISABLE signal does not go active after eighty nanoseconds because the deselect duration is less than the minimum duration. The single transition occurring to the ADDRESS input is propagated through X-DECODER 8, memory ARRAY 10, Y-DECODER 12 and SENSE AMPLIFIERS 14. The INTERNAL ADDRESS waveform has only one transition that follows the external ADDRESS input signal A. The time-averaged DC CURRENT for the waveforms of FIG. 4 is 18.75 milliamperes for the entire cycle. The single address transition results in a time-average AC CURRENT of fifteen milliamperes. The total current consumption for one-hundred nanosecond cycle is the sum of the DC and AC current components. Total time-averaged current consumption is 33.75 milliampere (18.75+15). This is a twenty-five percent reduction over the time-averaged current consumption of the prior-art. At lower operating frequencies (de-select time exceeding the minimum duration), the CHIP-DISABLE signal propagates through to address buffer 4 et al. and SENSE AMPLIFIERS 14.

Figure 5:
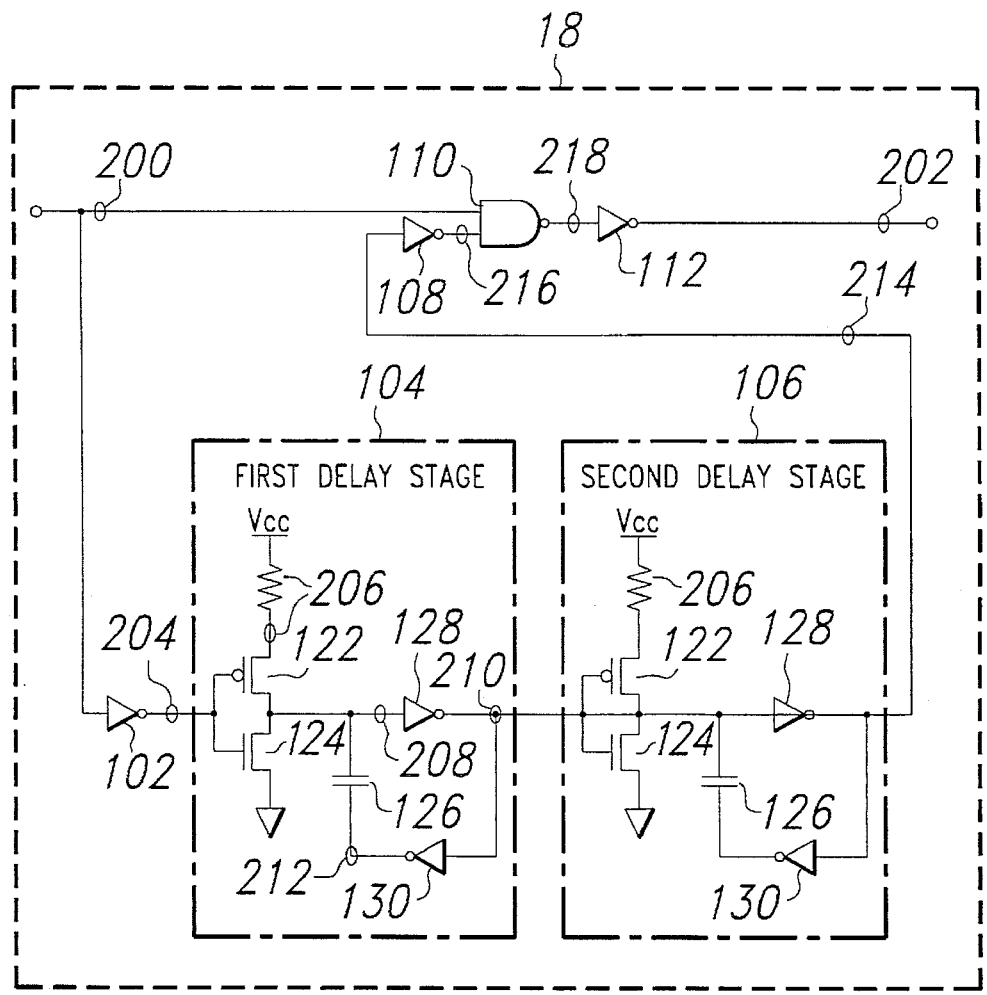
FIG. 5 is a circuit schematic of a delay function block of the device of FIG. 2.

FIG. 5 shows a circuit schematic of a DELAY function block 18 for use in the circuit of FIG. 2. Input signal 200 connects to the input of inverter 102. The output 204 of inverter 102 connects to the input of FIRST DELAY STAGE 104. The input 204 of FIRST DELAY STAGE 104 connects to the control gates of P-channel MOS transistor 122 and N-channel MOS transistor 124. The first source/drain diffusion of P-channel MOS transistor 122 connects to a first terminal of 10K ohm resistor 120. The second terminal of 10k ohm resistor 120 connects to the positive terminal of power supply $V_{cc}$. The second source/drain diffusion of P-channel MOS transistor 122 connects to signal node 208 and a first source/drain diffusion of N-channel MOS transistor 124. The second source/drain diffusion of N-channel MOS transistor 124 connects to circuit ground connection Vss. Signal 208 connects to a first terminal 208 of MOS capacitor 126 and the input of inverter 128. The output of inverter 128 connects to first stage 104 output terminal 210. The second terminal 212 of MOS capacitor 126 connects to the output of inverter 130. The input of inverter 130 is connected to first stage 104 output terminal 210. A SECOND DELAY STAGE 106 comprises components identical to those in FIRST DELAY STAGE 104. The input of SECOND DELAY STAGE 106 is connected to the output 210 of FIRST DELAY STAGE 104 and the input of inverter 128. The output of inverter 108 is connected to signal 216 and a first input of NAND gate 110. A second input of NAND gate 110 is connected to input signal 200. The output of NAND gate 110 is connected to signal 218 and the input of inverter 112. The output of inverter 112 forms the output 202 of function block 18.

Signal 200 of FIG. 5 corresponds to a chip-disable input. The rising edge of chip-disable signal 200 is delayed by inverter 102, FIRST DELAY STAGE 104, SECOND DELAY STAGE 106 and inverter 108. NAND gate 110 and inverter 112 implement an "AND" logic function between input signal 200 and its delayed counterpart signal 216. If input signal 200 remains high longer than delayed signal 216, output signal 202 is driven high. If input signal 200 transitions low before delayed signal 216 goes high, output signal 202 remains low. Delay function block 18 prevents active high disable pulses shorter than the minimum delay determined by FIRST DELAY STAGE 104 and SECOND DELAY STAGE 106 from propagating at output signal 202.

Figure 6:
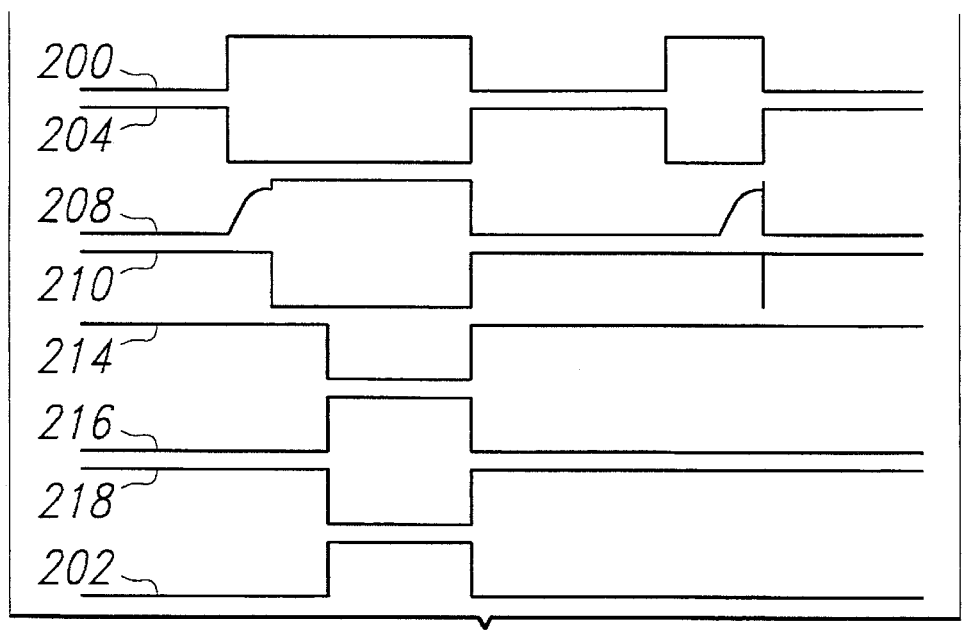
FIG. 6 is a waveform drawing illustrating operation of the delay function block of FIG. 5.

FIG. 6 shows waveform drawings of delay function block 18. Two disable pulses are shown for input signal 200. The first pulse duration exceeds the minimum rising edge delay determined by inverter 102, FIRST DELAY STAGE 104, SECOND DELAY STAGE 106 and inverter 108. The resulting output pulse 202 is shorter than the input pulse 200. The falling edge of signal 200 has only a minimal delay to output 202 determined by NAND gate 110 and inverter 112. The second pulse duration is shorter than the minimum rising edge delay determined by inverter 102, FIRST DELAY STAGE 104, SECOND DELAY STAGE 106 and inverter 108. Signal 216 remains low for the duration of the second pulse of signal 200 and causes output signal 202 to remain low.

While this invention has been described with respect to an illustrative embodiment, this description is not intended to be construed in a limiting sense. Upon reference to this description, various modifications of the illustrative embodiment, as well as other embodiments of the invention, will be apparent to persons skilled in the art. It is contemplated that the appended claims will cover any such modifications or embodiments that fall within the scope of the invention.

We claim:

1. A method of reducing voltage on power busses of an integrated circuit caused by short chip-disable durations, said method comprising:

detecting an external chip-disable pulse occurring before a minimum time duration;

preventing said chip-disable pulse from powering down selected internal DC paths of said integrated circuit; and simultaneously, preserving the output-driver high-impedance functionality of the chip-disable signal.

2. A method for reducing power consumption in an integrated circuit having at least one address buffer, sense amplifiers and output drivers, each said address buffer, sense amplifiers and output drivers having a disabling input, said integrated circuit including a chip-disabling signal and an output-disable signal, said method comprising:

delaying transmission of said disabling signal to said disabling input of said address buffer and said sense amplifiers, but not delaying transmission of said output-disable signal to said disabling input of said output drivers.

3. The method of claim 2, further including an output-disable buffer receiving said output-disable signal and said disabling signal and transmitting said output-disable signal to said output drivers.

4. A circuit for reducing power consumption in an integrated circuit, said circuit comprising:

a chip-enable buffer having a chip-enable signal input and an output;

an output-disable buffer having a output-disable signal input, a disabling input coupled to said output of said chip-enable buffer, and an output;

at least one address buffer having an address input and a disabling input;

sense amplifiers having a disabling input and having data outputs;

output drivers having a disabling input and having data inputs coupled to said data outputs of said sense amplifiers; and a delay circuit having an output and an input;

said input of said delay circuit coupled said output of said chip-enable buffer, said output of said delay circuit coupled to said disabling inputs of said address buffer and said disabling input of said sense amplifiers.

5. The circuit of claim 4, wherein said delay circuit further comprises:

a first inverter having an input coupled to said output of said chip-enable buffer and having an output; and at least one delay stage further comprising:

a P-channel and a N-channel transistor, each having a control gate and each having first and second source/drain diffusions, the control gates of each of said transistors coupled to said output of said first inverter;

a resistor having first and second terminals; the first source/drain diffusion of said P-channel MOS transistor coupled said first terminal of said resistor, the second terminal of said resistor coupled to a power supply;

a signal node coupled to the second source/drain diffusion of said P-channel transistor and to the first source/drain diffusion of said N-channel transistor, the second source/drain diffusion of said N-channel transistor coupled to a reference terminal;

a capacitor having a first terminal and a second terminal, said first terminal of said capacitor coupled to said signal node;

a second inverter having an input and an output, said input of said second inverter coupled to said signal node, said output of said second inverter coupled to said output of said delay stage; and a third inverter having an input and an output, said input of said third inverter coupled to said second terminal of said capacitor, said output of said third inverter coupled to said output of said delay stage.

\* \* \* \* \*